United States Patent [19]

Kuwahara

[11] Patent Number: 5,821,580

[45] Date of Patent: Oct. 13, 1998

[54] MOS DEVICE HAVING A TRENCH GATE STRUCTURE

[75] Inventor: Masashi Kuwahara, Yokohama, Japan

[73] Assignee: Kabushiki Kaisha Toshiba, Kawasaki, Japan

[21] Appl. No.: 840,931

[22] Filed: Apr. 25, 1997

[30] Foreign Application Priority Data

Apr. 30, 1996 [JP] Japan .................................. 8-109506

[51] Int. Cl.$^6$ ...................................................... H01L 29/76
[52] U.S. Cl. .......................................... 257/330; 257/341
[58] Field of Search ..................................... 257/341, 330

*Primary Examiner*—Mark V. Prenty
*Attorney, Agent, or Firm*—Oblon, Spivak, McClelland, Maier & Neustadt, P.C.

[57] ABSTRACT

In an IGBT of the trench gate structure having a current sensing function, a plurality of trench gates are formed in each of a main current cell region and a current sensing cell region. Of these trench gates, the trench gates formed at end portions of the cell regions have no source regions on their opposing faces so as to prevent channels from being formed at least on the opposing faces. The interval between the opposing channel faces of the main current cell region and current sensing cell region is increased in order that the resistance of a parasitic resistor becomes considerably higher than that of an external resistor leaving an interval between first and second P-type base regions unchanged. The operation imbalance between the cell regions can be prevented by setting the carrier distribution in the current sensing cell region directly under the second base region substantially equal to that in the main current cell region. Thus, both the temperature characteristic and withstanding characteristic of the device can be achieved and the linearity of the main current and sensed current can be improved.

6 Claims, 3 Drawing Sheets

MOS DEVICE HAVING A TRENCH GATE STRUCTURE

BACKGROUND OF THE INVENTION

The present invention relates to a vertical MOS (metal oxide semiconductor) device having a trench gate structure and, more specifically, to a MOS device having a current sensing function wherein a plurality of main current cells and at least one current sensing cell are formed on a single substrate.

Recently, for example, a MOSFET (MOS field effect transistor) and an IGBT (insulated gate bipolar transistor) each having a trench gate structure have been developed as a MOS device with a current sensing function. In this type of device, generally, an external resistor is connected between a main electrode and a sensing electrode to detect a difference in potential therebetween and thus sense a current.

FIG. 1 is a cross-sectional view showing an N-channel MOSFET as an example of a MOS device of a trench gate structure having a current sensing function. In this MOSFET, for example, a plurality of P-type base regions 102 are selectively formed on the surface of an N-type drift region 101. One N-type source region 103 is provided on at least one of the base regions 102, and a plurality of N-type source regions 103 are selectively formed on the surface of the other base region 102. A plurality of trenches 104 are each formed to such a depth as to reach the drift region 101 through the source region 103 and the base region 102. An electrode material 106 is buried into each of the trenches 104 with a gate insulation film 105 interposed therebetween, with the result that a plurality of trench gates 107 connected to a gate electrode (not shown) are formed.

An N-type semiconductor layer 108 serving as a drain region is provided on the undersurface of the drift region 101. A drain electrode 109 is formed on the semiconductor layer 108.

Interlayer insulation films 110 and 111 are selectively provided on the surface of the drift region 101. The interlayer insulation film 110 is provided so as to include part of the source region 103 and cover the surface of the gate 107. The interlayer insulation film 111 is provided so as to cover part of each of the base regions 102 and the surface of the drift region 101 between the base regions 102. A main electrode (source electrode) 112 and a current sensing electrode 113 are formed on the base regions 102 with the interlayer insulation film 111 interposed therebetween, with the result that a main current cell region (main current element) 114 having a plurality of main current cells and a current sensing cell region (current sensing element) 115 having at least one current sensing cell are electrically isolated from each other. In other words, the MOSFET is so constituted that at least one current sensing cell region 115 is formed adjacent to one (or plural) main current cell region 114.

According to the MOSFET so constituted, the main current cell region 114 and current sensing cell region 115 are connected to each other through the N-type drift region 101 in the normal current sensing state where the channel of the MOS gate is open. Part of the current of the current sensing cell region 115, which is originally to flow through an external resistor (not shown), flows into the main current cell region 114 through an internal parasitic resistor. Since the parasitic resistor is a bulk resistor formed of silicon, it has temperature characteristics, and the resistance increases as temperature rises. Therefore, the MOSFET so constituted has a problem in which the current flowing into the external resistor is increased as temperature rises, and a sensed voltage (potential difference between external resistors) is heightened.

To resolve the above problem, for example, it can be thought that the resistance of the parasitic resistor is set higher in advance than that of the external resistor to lessen an influence of temperature characteristics of the parasitic resistance. To enlarge an interval between the main current cell region 114 and current sensing cell region 115 is effective in increasing the resistance of the parasitic resistor.

If, however, the resistance of the parasitic resistor is increased by enlarging the width of the N-type drift region 101 connecting the main current cell region 114 and current sensing cell region 115, the interval between the P-type base regions 102 is increased, where the curvature of a depletion layer is increased and an electric field in concentrated, thereby decreasing in withstanding voltage. For this reason, conventionally, the interval between the main current cell region 114 and current sensing cell region 115 has to be set so as to satisfy both the minimum distance necessary for electrically isolating these regions and the maximum distance by which the withstanding voltage lowers. It is thus difficult to satisfy both the temperature and withstanding characteristics at the same time.

The above drawback is true of not only the MOSFET described above but also an IGBT of the trench gate structure having a current sensing function. The IGBT also has a drawback wherein the precision of current sensing is reduced by deterioration in linearity between the main current and sensed current.

FIG. 2 is a cross-sectional view illustrating an N-channel IGBT as an example of a MOS device of a trench gate structure having a current sensing function. In this IGBT, for example, a plurality of P-type base regions 202 are selectively formed on the surface of an N-type drift region 201. One N-type source region 203 is provided on at least one of the base regions 202, and a plurality of N-type source regions 203 are selectively formed on the surface of the other base region 202. A plurality of trenches 204 are each formed to such a depth as to reach the drift region 201 through the source region 203 and the base region 202. An electrode material 206 is buried into each of the trenches 204 with a gate insulation film 205 interposed therebetween, with the result that a plurality of trench gates 207 connected to a gate electrode (not shown) are formed.

A P-type semiconductor layer 208 serving as a collector region is provided on the undersurface of the drift region 201. A collector electrode 209 is formed on the semiconductor layer 208.

Interlayer insulation films 210 and 211 are selectively provided on the surface of the drift region 201. The interlayer insulation film 210 is provided so as to include part of the source region 203 and cover the surface of the gate 207. The interlayer insulation film 211 is provided so as to cover part of each of the base regions 202 and the surface of the drift region 201 between the base regions 202. A main electrode (source electrode) 212 and a current sensing electrode 213 are formed on the base regions 202 with the interlayer insulation film 211 interposed therebetween, with the result that a main current cell region (main current element) 214 having a plurality of main current cells and a current sensing cell region (current sensing element) 215 having at least one current sensing cell are electrically isolated from each other. In other words, the IGBT is so constituted that at least one current sensing cell region 215 is formed adjacent to one (or plural) main current cell region 214.

In the IGBT so constituted, that surface of the N-type drift region 201, which is directly under the P-type base region 202 between adjacent trench gates 207, serves as a carrier storage layer, and on-voltage and switching characteristics are varied with the number of carriers stored in the carrier storage layer. For this reason, the balance of current between a unit cell at the end of the IGBT and another unit cell is lost. This current imbalance is not a serious problem to a normal IGBT. If, however, such a cell is used as a current sensing cell, the current sensing cell is decreased in number and thus the imbalance of operation between cells degrades linearity between the main current and sensed current, with the result that the precision of current sensing is lowered.

BRIEF SUMMARY OF THE INVENTION

An object of the present invention is to provide a MOS device having a trench gate structure capable of improving in temperature characteristics of sensed current and in linearity between the main current and sensed current and enhancing the precision of current sensing.

In order to attain the above object, there is provided a MOS device having a trench gate structure, comprising at least one main current cell having trench gate electrodes and provided on a semiconductor substrate and at least one current sensing cell having trench gate electrodes and provided adjacent to the main current cell on the semiconductor substrate, wherein a channel is prevented from being formed on each of opposing sides of adjacent trench gate electrodes provided at end portions of the main current cell and the current sensing cell.

There is also provided a MOS device having a trench gate structure, comprising a main current cell region including at least one main current cell having a main electrode and a current sensing cell region including at least one current sensing cell having a sensing electrode, wherein the main current cell of the main current cell region and the current sensing cell of the current sensing cell region each includes at least one first region of a second conductivity type formed on a surface of a semiconductor substrate of a first conductivity type, a plurality of second regions of the first conductivity type selectively formed within the first region, and a plurality of trench gate electrodes each provided in a trench with a gate insulation film therebetween, the trench being formed to such a depth as to reach the semiconductor substrate through the first region, the second regions being provided on sides other than opposing sides of adjacent trench gate electrodes formed at end portions of the main current cell region and the current sensing cell region.

According to the MOS device having the trench gate structure described above, the resistance of a parasitic resistor can be set much higher than that of an external resistor without decreasing in withstanding voltage, and the carrier distribution directly under the base region of the current sensing cell can be made substantially equal to that of the main current cell. It is thus possible to satisfy both the temperature and withstanding characteristics of the device and prevent an imbalance of operations between the cells.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention

DETAILED DESCRIPTION OF THE INVENTION

Embodiments of the present invention will now be described with reference to the accompanying drawings.

Figure 3A:
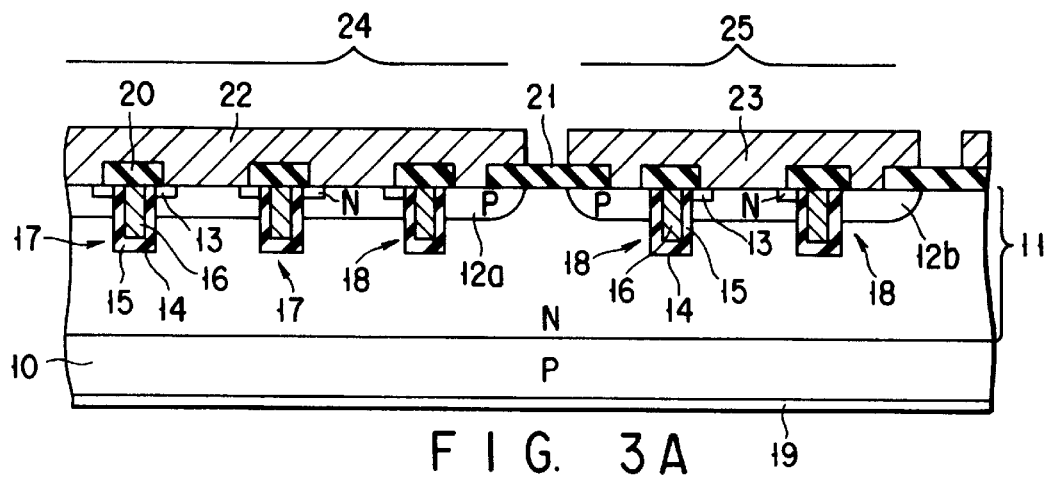
FIGS. 3A and 3B are views illustrating the main part of an IGBT of a trench gate structure having a current sensing function, according to a first embodiment of the present invention.
Figure 3B:
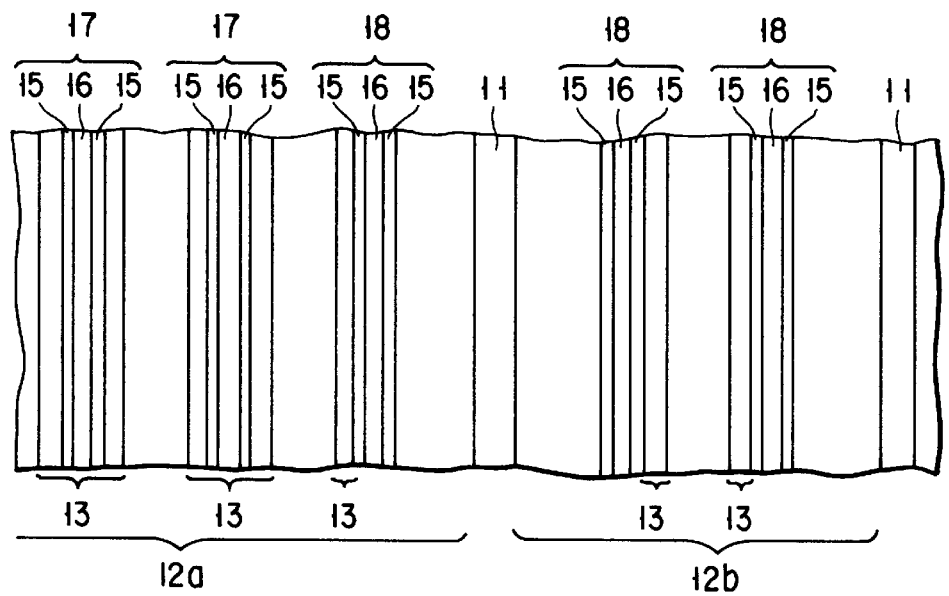

FIGS. 3A and 3B illustrate the constitution of an N-channel IGBT of a trench gate structure having a current sensing function according to a first embodiment of the present invention. FIG. 3A is a cross-sectional view of the major part of the N-channel IGBT, while FIG. 3B is a plan view showing a pattern of regions on the substrate of the IGBT of FIG. 3A.

In the IGBT, for example, an N-type drift region (semiconductor substrate of a first conductivity type) 11, which has an impurity concentration and a thickness according to a withstanding voltage is provided on one surface of a P-type (second conductivity type) semiconductor layer 10. At least first and second P-type base regions (first region) 12a and 12b are selectively formed to a predetermined depth in the surface area of the drift region 11, and a plurality of N-type source regions (second region) 13 are selectively provided to a predetermined depth in the surface areas of the base regions 12a and 12b.

A plurality of trenches 14 are each formed to such a depth as to reach the drift region 11 through the source region 13 and base region 12a and filled with an electrode material 16 with a gate insulation film 15 interposed therebetween, thus forming a plurality of trench gates 17, connected to the gate electrodes (not shown), in the first base region 12a. Furthermore, trench gates 18 are formed at an end portion of the first base region 12a and in the second base region 12b. Each of the trench gates 18 are provided with a source region 13 only on one side facing inward in the corresponding base region. (No source region is formed on the other side of the trench gate). In other words, dummy trench gates 18 are formed at end portions of the first and second base regions 12a and 12b which are arranged adjacent to each other through the drift region 11, and no channels are formed at least on the opposing sides of the trench gates 18.

A collector electrode 19 is provided on the other surface of the semiconductor layer 10.

Interlayer insulation films 20 are formed on the surface of the drift region 11 so as to cover the surfaces of the gates 17 and 18 including part of the source regions 13 and part of the first and second base regions 12a and 12b. Another interlayer insulation film 21 is also provided so as to cover part of each of the first and second base regions 12a and 12b and the surface of the drift region 11 between the base regions 12a and 12b. A main electrode (source electrode) 22 serving as a lead-out electrode and a current sensing electrode 23 are formed on the first and second base regions 12a and 12b.

In the above IGBT so constituted, one (or plural) main current cell region (main current element) 24 having a plurality of main current cells and a current sensing cell region (current sensing element) 25 having at least one current sensing cell are electrically isolated from each other on the drift region 11. In other words, at least one current sensing cell region 25 is provided adjacent to one (or plural) main current cell region 24 connected to the main electrode 22. An external resistor (not shown) is connected between the main electrode 22 and current sensing electrode 23, and a current is sensed by detecting a difference in potential between both ends of the external resistor.

In the foregoing IGBT, a source region is not formed on each of the opposing sides of the trench gates 18 at the end portions of the cell regions 24 and 25, nor is a channel. Thus, the distance between the cell regions 24 and 25 can substantially be increased without broadening the N-type drift region 11 connecting the cell regions 24 and 25. The resistance of the parasitic resistor can be considerably higher than that of the external resistor leaving the interval between the first and second base regions 12a and 12b unchanged, thereby improving only in temperature characteristics of sensed currents without decreasing in withstanding voltage.

Since, moreover, the carrier distribution directly under the second base region 12b of the current sensing cell region 25 can be set almost equal to that of the main current cell region 24, the linearity between the main current and sensed current can be improved.

As described above, the resistance of the parasitic resistor can be increased more than that of the external resistor, and the carrier distribution directly under the base region of the current sensing cell region can be almost equal to that of the main current cell region.

No source regions are formed on the opposing sides of the trench gates provided at the end portions of the first and second base regions of the adjacent main current cell region and current sensing cell region. Since, therefore, no channels are formed on the opposing faces of these cell regions, the distance therebetween can substantially be increased and the operation imbalance therebetween can be prevented. As a result, both the temperature and withstand characteristics of the device can be satisfied at once, and the linearity between the main current and sensed current can be improved, thus greatly improving in precision of current sensing.

The above-described IGBT can easily be manufactured and mass-produced by the same process as that of the conventional IGBT only by changing, for example, a mask pattern for forming the source region.

In the first embodiment described above, no channels are formed on the opposing sides of the trench gates provided at the end portions of the main current cell region 24 and current sensing cell region 25. The present invention is not limited to this. For example, no channel can be formed on either side of each trench gate.

Figure 4:
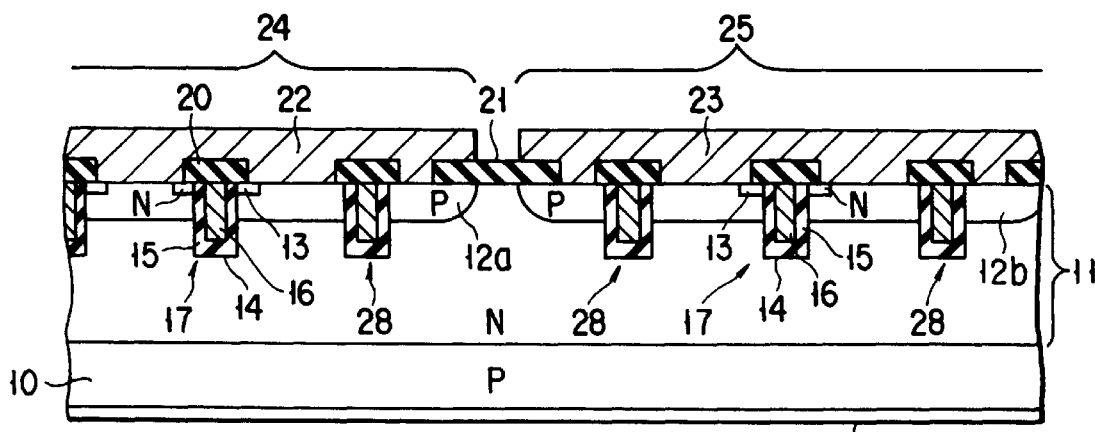
FIG. 4 is a cross-sectional view illustrating the main part of an IGBT of a trench gate structure having a current sensing function, according to a second embodiment of the present invention.

FIG. 4 illustrates an IGBT of the trench gate structure having a current sensing function according to a second embodiment of the present invention.

In the IGBT of the second embodiment, trench gates 28 each having no channel on either side are formed at end portions of the main current cell region 24 and current sensing cell region 25. In this case, since the distance between the cell regions 24 and 25 can substantially be increased, a better result can be expected with respect to the temperature characteristics of sensed current.

Figure 5:
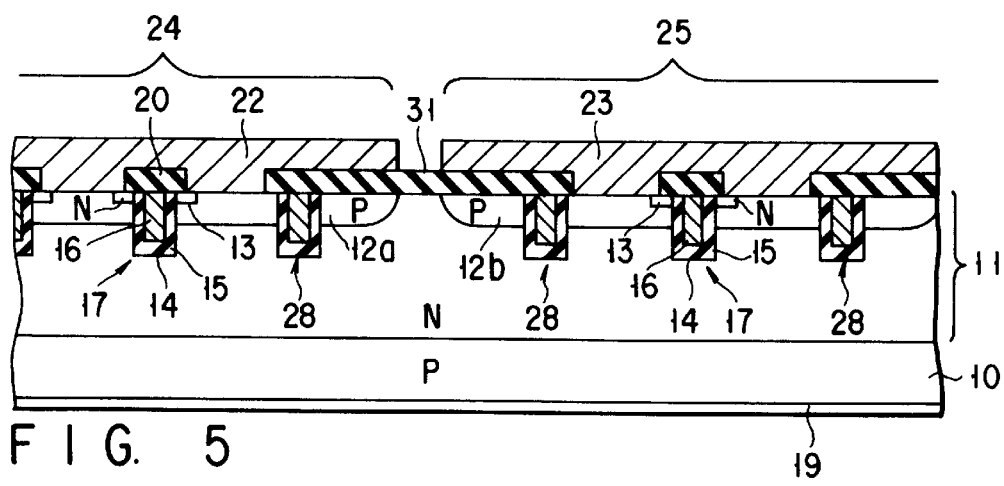
FIG. 5 is a cross-sectional view illustrating the main part of an IGBT of a trench gate structure having a current sensing function, according to a third embodiment of the present invention.

FIG. 5 illustrates an IGBT of the trench gate structure having a current sensing function according to a third embodiment of the present invention.

In the IGBT of the third embodiment, an interlayer insulation film 31 is provided so as to cover the end portions of the main current cell region 24 and current sensing cell region 25. In this case, minority carriers can be prevented from being discharged from the first and second base regions 12a and 12b at the end portions of the cell regions 24 and 25, to their corresponding electrodes 22 and 23. For this reason, an adverse influence of minority carriers, which is not a serious problem to a unipolar device such as a MOSFET, can be mitigated.

If the trench gates 28 each having no channel on either side thereof are formed at the end portions of the current sensing cell region 25, then they will be arranged on both sides of the trench gate 17 having channels on both sides. Thus, the carrier distribution in which the trench gates are formed is closer to that in the main current cell region 24, and the linearity between the main current and sensed current can be improved further.

Figure 1:
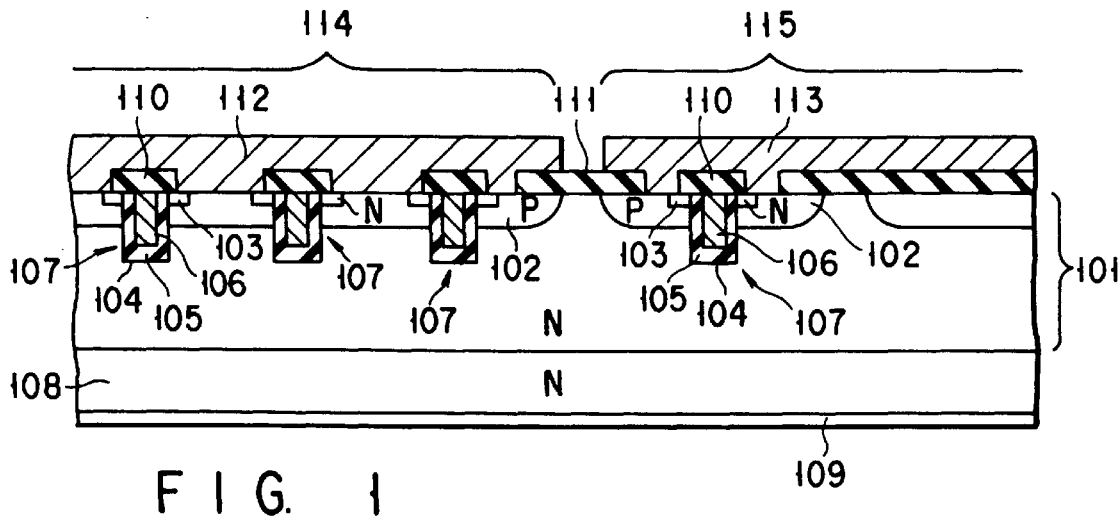
FIG. 1 is a cross-sectional view illustrating the main part of a MOSFET of a trench gate structure having a current sensing function, in order to explain prior art and its problems.
Figure 2:
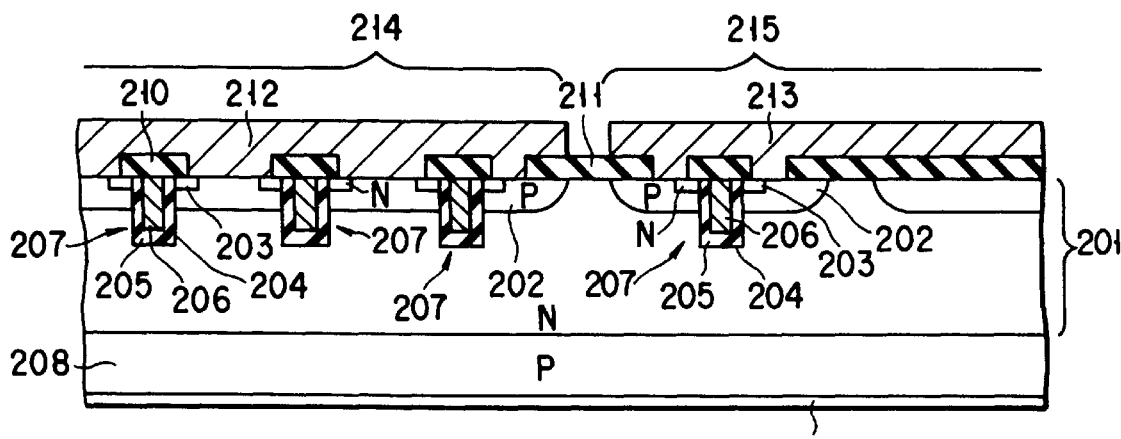
FIG. 2 is a cross-sectional view illustrating the main part of a prior art IGBT of a trench gate structure having a current sensing function.
Figure 6:
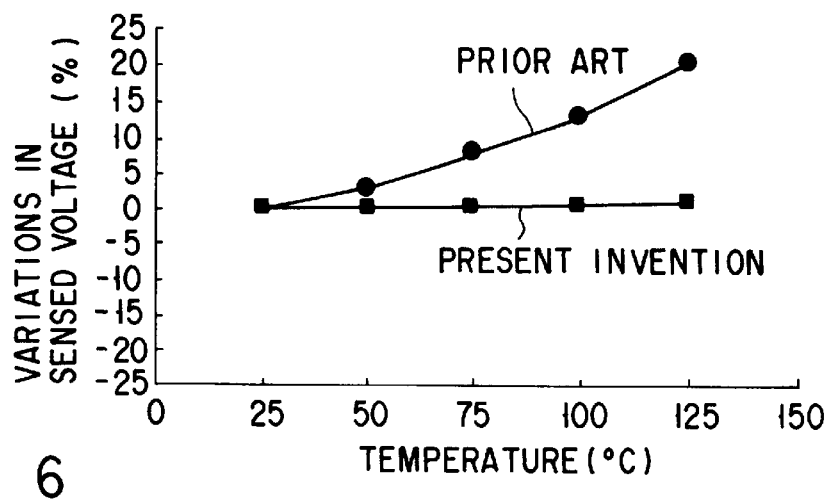
FIG. 6 is a graph showing temperature characteristics of sensed currents for both the present invention and prior art.

FIG. 6 shows a comparison of temperature characteristics of sensed currents between the IGBT of the third embodiment of the present invention and the prior art IGBT (FIG. 2).

As is apparent from FIG. 6, in the present invention, the dependency of a sensed voltage upon variations in temperature (°C.) is considerably low. If, therefore, the device is increased in temperature, the sensed voltage is almost fixed, and the temperature characteristic of current sensing is more excellent than that of the prior art device.

Figure 7:
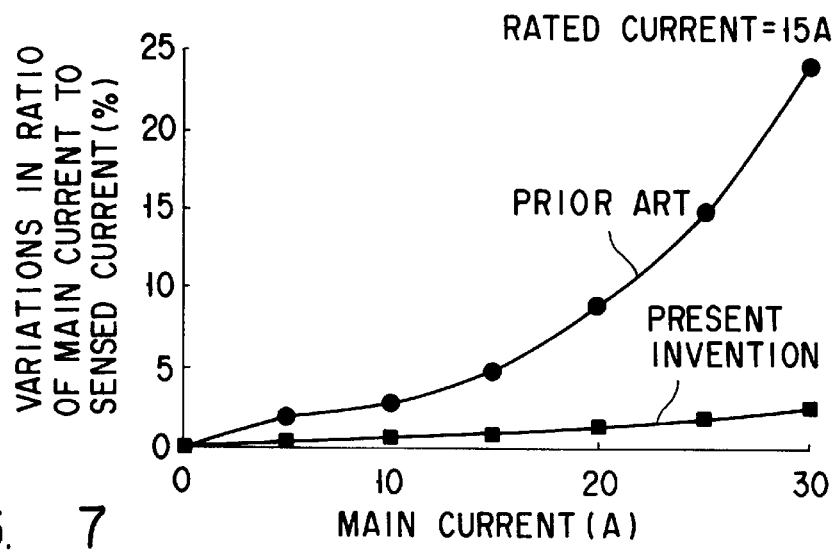
FIG. 7 is a graph showing a relationship between the main current and the ratio of the main current to the sensed current for both the present invention and prior art.

FIG. 7 shows a relationship between the main current and the ratio of the main current to the sensed current with respect to the IGBT of the third embodiment and the prior art IGBT (FIG. 2).

As is apparent from FIG. 7, if, in the present invention (rated current is 15 A), the main current is 30 A, the variation (%) in ratio of the main current and sensed current is about $\frac{1}{10}$ or less that in the prior art. It is also understood from this that both the temperature characteristic of the sensed current and the linearity between the main current and sensed current are satisfactory and a current can be sensed with high precision.

Figure 8:
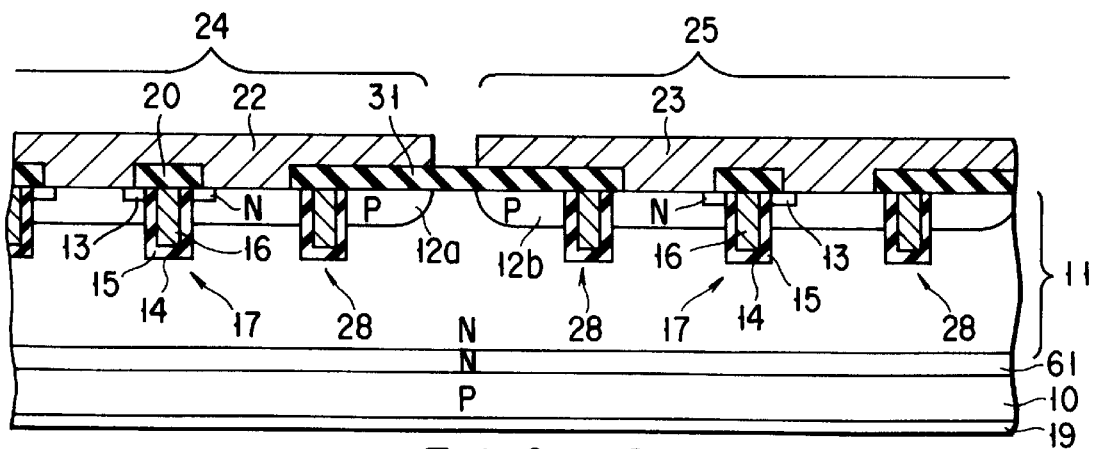
FIG. 8 is a cross-sectional view illustrating the main part of an IGBT of a trench gate structure having a current sensing function, according to a fourth embodiment of the present invention.

As an IGBT of the trench gate structure having a current sensing function, the present invention can be applied to an IGBT wherein an N-type buffer region 61 is formed between the P-type semiconductor layer 10 and N-type drift region 11, as shown in FIG. 8 (fourth embodiment). This constitution can be applied to the IGBTs of the first and second embodiments as well as that of the third embodiment.

In all the foregoing embodiments, the present invention is applied not only to an IGBT of the trench gate structure having a current sensing function but also to several types of MOS devices.

Moreover, the present invention is not limited to an N-channel MOS device. For example, it can be applied to a P-channel MOS device if the conductivity type is reversed.

In the above embodiments, only one main current cell region having a plurality of main current cells is formed. However, there are no restrictions on the number of main current cells or the number of cells included therein.

It is needless to say that various changes and modifications can be made without departing from the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A MOS device having a trench gate structure, comprising:

a main current cell region including at least one main current cell having a main electrode; and a current sensing cell region including at least one current sensing cell having a sensing electrode, wherein the main current cell of said main current cell region and the current sensing cell of said current sensing cell region each includes:

at least one first region of a second conductivity type formed on a surface of a semiconductor substrate of a first conductivity type;

a plurality of second regions of the first conductivity type selectively formed within said first region; and a plurality of trench gate electrodes each provided in a trench with a gate insulation film therebetween, said trench being formed to such a depth as to reach the semiconductor substrate through said first region, said second regions being provided on sides of said trench gate electrodes other than opposing sides of adjacent trench gate electrodes formed at end portions of said main current cell region and said current sensing cell region, said second regions not being formed on said opposing sides of adjacent trench gate electrodes formed at said end portions of said main current cell region and said current sensing cell region.

2. The MOS device according to claim 1, wherein said second regions are provided on both sides of the trench gate electrodes other than the trench gate electrodes formed at the end portions of said main current cell region and said current sensing cell region.

3. The MOS device according to claim 1, wherein an insulation film is provided between each of the first regions, which are interposed between adjacent trench gate electrodes at the end portions of said main current cell region and said current sensing cell region, and the main electrode and between the other first region and the sensing electrode.

4. The MOS device according to claim 1, wherein a semiconductor layer of the first conductivity type is formed on an undersurface of said semiconductor substrate.

5. The MOS device according to claim 1, wherein a semiconductor layer of the second conductivity type is formed on an undersurface of said semiconductor substrate.

6. The MOS device according to claim 5, wherein a buffer region of the first conductivity type is provided between said semiconductor substrate and said semiconductor layer.

* * * * *